United States Patent [19]
Nakamura et al.

[11] Patent Number: 6,127,623
[45] Date of Patent: Oct. 3, 2000

[54] SOLAR CELL AND PRODUCTION PROCESS THEREFOR

[75] Inventors: Kazuyo Nakamura, Kitakatsuragi-gun; Kenzo Kawano, Yoshino-gun; Hidetoshi Washio, Kashihara; Yoshifumi Tonomura, Sakurai; Kunio Kamimura, Kashiba; Hideyuki Ueyama, Nara, all of Japan

[73] Assignee: Sharp Kabushiki Kaisha, Osaka, Japan

[21] Appl. No.: 09/342,505

[22] Filed: Jun. 29, 1999

[30] Foreign Application Priority Data

Jul. 3, 1998 [JP] Japan .................................. 10-188361

[51] Int. Cl.$^7$ .............................................. H01C 31/0236
[52] U.S. Cl. ................................ 136/256; 438/29; 438/71
[58] Field of Search ................................ 136/255, 256; 438/29, 71; 216/2

[56] References Cited

U.S. PATENT DOCUMENTS

| | | | |
|---|---|---|---|
| 3,985,579 | 10/1976 | Rahilly | 136/89 |
| 5,024,953 | 6/1991 | Uematsu et al. | 437/2 |
| 5,067,985 | 11/1991 | Carver et al. | 136/255 |
| 5,098,482 | 3/1992 | Warfield | 136/259 |
| 5,248,621 | 9/1993 | Sano | 437/2 |
| 5,503,898 | 4/1996 | Lauf | 428/149 |
| 5,578,858 | 11/1996 | Mueller et al. | 252/432 |
| 5,704,992 | 1/1998 | Willeke et al. | 136/255 |
| 5,792,280 | 8/1998 | Ruby et al. | 136/258 |
| 5,817,396 | 10/1998 | Perlo et al. | 428/141 |

FOREIGN PATENT DOCUMENTS 7-142755  6/1995  Japan .

OTHER PUBLICATIONS

Knobloch et al., "High–Efficiency Solar Cells From FZ, CZ and MC Silicon Material," Proceedings of The Photovoltaic Specialists Conference, 23rd conference, pp. 271–276, May, 10, 1993.

Anders et al., "Novel Light Trapping Scheme for Thin Crystalline Cells . . . ", pp. 263–266q, 1997.

Martin Verbeek, et al., 1996 IEEE, "Mechanically Grooved High–Efficiency Silicon Solar Cells . . . ", pp. 521–524.

C. Gerhards, et al., 1997 IEEE, "Mechanically V–Textured Low Cost Multicrystalline Silicon Solar Cells . . . ", pp. 43–46.

Anders M, et al., 1997 IEEE, "Novel Light Trapping Scheme for Thin Crystalline Cells . . . ", pp. 263–266.

*Primary Examiner*—Nam Nguyen
*Assistant Examiner*—Michael C. Miggins
*Attorney, Agent, or Firm*—Nixon & Vanderhye P.C.

[57] ABSTRACT

A solar cell comprises a crystalline substrate having projections and depressions formed on either side or both sides of the substrate, wherein a projection-depression depth is 25 $\mu$m or more.

8 Claims, 9 Drawing Sheets

SOLAR CELL AND PRODUCTION PROCESS THEREFOR

CROSS-REFERENCE TO RELATED APPLICATION

This application is related to Japanese application No. HEI 10-188361 filed on Jul. 3, 1998, whose priority is claimed under 35 USC § 119, the disclosure of which is incorporated by reference in its entirety.

BACKGROUND OF THE INVENTION

1. Field of the Invention

The present invention relates to a solar cell and a production process therefor. More particularly, the present invention relates to a space-use solar cell to be on board of an artificial satellite and a process for producing such solar cells.

2. Description of Related Art

The construction of conventional solar cells of this kind, especially, conventional common solar cells for space use, is described with reference to accompanying figures.

FIG. 7 shows a perspective view illustrating the construction of a conventional common high-efficiency solar cell for space use. The solar cell is composed of a crystalline substrate 1 of a first conductivity type, e.g., of a P-type silicon substrate, a region 2 of a second conductivity type, e.g., of N-type, formed on a light-receptive face (upper surface) of the substrate 1, a $P^+$-type region 3 formed on a lower surface of the substrate 1 for a back surface field (BSF) effect, an insulating film 4 on an N-type region side which is formed on a upper surface of the N-type region 2, an insulating film 5 on a $P^+$-type region side which is formed on a lower surface of the $P^+$-type region 3, an N-electrode 6 provided on a surface of the N-type region 2, a P-electrode 7 covering almost the entire lower surface of the $P^+$-type-region-side insulating film 5, an anti-reflection film 8 covering almost the entire upper surface of the N-type-region-side insulating film 4 and the like. On the light-receptive face, a reflection-reducing surface structure 9 having a large number of projections and depressions, for example in the shape of inverted-pyramid, is provided for reducing reflection.

FIG. 8 is a perspective view illustrating the construction of a simplified common solar cell for space use. The light-receptive face thereof has a substantially flat structure 10.

The high-efficiency solar cell for space use is produced, for example, by a process as shown in schematic sectional views of FIGS. 9(a) to 9(g) illustrating a production process.

For example, a semiconductor substrate 12 which has been cut from an ingot of monocrystalline silicon in the form of a wafer is usually about 300 μm thick at the thinnest. This semiconductor substrate is etched with an acid or alkaline solution or polished to a thickness d1 of 50 μm to 200 μm, thereby to obtain a substrate 1 (see FIG. 9(a)). This thickness is determined depending on complexity of later production steps and desired solar cell characteristics.

Generally, the thinner the substrate is, the less the characteristics of solar cells deteriorate by being exposed to radiation such as cosmic rays. On the other hand, the thinner the substrate is, the more difficult the production is. The substrate is required to be strong to a certain degree, that is, must be somewhat thick, especially for producing a solar cell which has a high photoelectric conversion efficiency and thus has a complicated structure.

For example, in the case of a monocrystalline silicon solar cell as shown in FIG. 8 which requires relatively simple production steps later, the production thereof is easy and the thickness d1 of the substrate may be selected within the range of about 30 μm to about 300 μm depending on the cell characteristics. However, since the construction of the cell is simple, the photoelectric conversion efficiency is low. The initial photoelectric efficiency with regard to an AM0 light source before exposure to radiation is about 14%.

In contrast, in the case of a high-efficiency solar cell as shown in FIG. 7 which has a complicated construction, an initial photoelectric efficiency of about 17% can be obtained. However, this type of solar cell is more difficult to produce than the cell of FIG. 8, and when a thin substrate is used, the substrate often breaks during the production process. The construction of the cell including the thickness of the substrate is designed in view of the photoelectric conversion efficiency, the surface structure of the substrate or the like.

The silicon substrate which has been processed to have a thickness suitable for required cell characteristics is then passed through a number of washing steps. Thereafter, an uneven surface is formed on the light-receptive face of the substrate, to form a reflection-reducing surface structure. At this time, the reflection-reducing surface structure is formed in projections and depressions having a depth within a certain range in consideration of workability, conventionally. The depth here is the distance from the top of the projections to the bottom of the depressions, and also referred to as a projection-depression depth in some parts of this description.

For example, in the case of a solar cell using a monocrystalline silicon substrate, which is relatively easy to pattern, the surface structure is formed by etching. From the viewpoint of workability, it is important to shorten etching time as much as possible and to improve the accuracy of etching by reducing the area/volume of portions not to be etched. The projection-depression depth d2 (see FIG. 9(e)) of this solar cell is about 5 μm to about 15 μm.

The reflection-reducing surface structure, in the case of using a silicon substrate, is often formed to have projections and depressions which provide a so-called texture structure. The texture structure means a structure which may be formed in projections and depressions on a surface by utilizing differences in etch rate such that, when crystalline silicon is etched with a thin aqueous alkali solution, a (100) face in crystal orientation has a faster etch rate and a (111) face has a slower etch rate. In the texture structure, a projection is sometimes shaped in a pyramid (referred to as a normal pyramid) or a depression is sometimes formed by removing a pyramid shape (referred to as an inverted pyramid). The texture structure usually has a regular projection-depression structure which forms a lattice pattern as seen from a direction perpendicular to the surface and may be formed with use of a mask for etching which is made in a regular geometric pattern.

Such a texture structure may be formed, for example, by the following process.

In the case of using a monocrystalline silicon substrate, a mask material 13 to be used as a etching mask such as an oxide film is disposed on the substrate (see FIG. 9(b)).

Subsequently, the mask material 13 is patterned into a mask layer 15 by a photolithography and etching technique. At this time, if the monocrystalline silicon substrate has the (100) face, the mask layer 15 is as follows; transferred to the mask material 13 is a pattern having square windows 11 which have sides parallel to or perpendicular to a direction of an axis similar to a <110> axis of the crystal of the monocrystalline silicon and whose side length is about 10 μm to about 20 μm and frames 14 of 1 μm width surrounding the windows 11, the square windows being continuously arranged at a pitch p1 of about 10 μm to about 20 μm. Thus a mask layer 15 having repeatedly arranged square windows (see FIG. 9(c)) is formed.

The monocrystalline silicon substrate 1 together with the mask layer 15 is immersed in a thin aqueous alkali solution to form projections and depressions (the reflection-reducing structure) 9 on the surface of the silicon substrate (see FIG. 9(d)). The thin aqueous alkali solution for etching may be, for example, an aqueous solution of potassium hydroxide of several percents which is heated to several ten degrees centigrade. By this process, the surface of the silicon substrate is etched at different etch rates depending on crystal orientation. As a result of using the mask material patterned into the aforesaid pattern, the surface of the silicon substrate is etched into a projection-depression surface structure which has a number of continuously arranged depressions 16 in the form of inverted pyramids exposing the (111) faces 19 which have the slowest etch rate.

This structure is generally called an inverted-pyramid texture structure since a lattice pattern can be seen from the direction perpendicular to the surface of the substrate. This texture structure may be produced to have a projection-depression depth d2 of 5 μm to 15 μm by setting a pitch p1 for arranging the squares of the mask pattern to 10 μm to 20 μm (see FIG. 9(e)).

After thus forming the monocrystalline silicon substrate 1 having the projections and depressions 9 of the reflection-reducing structure on the light-receptive side, a P-type diffusion layer 3 and an N-type high-concentration diffusion layer 2 are formed on the opposite side (non-light-receptive side) and on the light-receptive side, respectively (see FIG. 9(f)). An N-type-region-side insulating film 4 and a P$^+$-type-region-side insulating film 5 are formed. Thereafter, electrodes 6 and 7 are formed on the light-receptive side and the opposite side, and an anti-reflection film 8 is formed on the entire surface of the light-receptive face. Then, the substrate is cut into the final size, thereby to finish a monocrystalline silicon solar cell for space use (see FIGS. 9(g) and 7).

In space, an extremely large number of cosmic rays fly around. Space-use solar cells to be used in such environment are designed in view of the effect of cosmic rays. Solar cells exposed to radiation such as cosmic rays deteriorate in their characteristics including conversion efficiency, though the degree of deterioration varies depending on the types of solar cells. It can be said to be one of the most significant challenges in the designing of solar cells to realize the highest value for the minimum output (final output) during use in view of exposure to radiation in a use environment.

An artificial satellite in a stationary orbit is said to be exposed to about $1 \times 10^{15}/cm^2$ of cosmic rays in terms of electron beams having an acceleration energy of 1 MeV for about ten years. The life of solar cells is often calculated using this level as a reference for a radiation resistant characteristic. Actually solar cells are exposed to this dose of electron beams for testing purposes, and a variety of data used for designing are computed from results of such exposure tests.

For example, the photoelectric conversion efficiency to an AM0 light source of common space-use silicon solar cells after exposure to 1 MeV electron beams at $1 \times 10^{15}/cm^2$ is about 10%, that of high-efficiency silicon solar cells is about 12%, and that of GaAs-base solar cells is about 13%. As shown by these figures, GaAs materials may provide a more excellent radiation resistance for solar cells than silicon materials.

Silicon materials for electronic devices have a number of advantages which other materials do not have: the silicon materials can be generally used; their properties are well known; they are lower-priced than other semiconductor materials such as GaAs; they are stabile in quality; they are actually used in space environment. For these reasons, silicon solar cells are in widespread use as space-use solar cells. However GaAs-base solar cells, which have an advantage in the radiation resistance, often compete with the silicon solar cells.

If the radiation resistance of the silicon materials can be dramatically improved and their photoelectric conversion efficiency to the AM0 light source after exposure to 1 MeV electron beams at $1 \times 10^{15}/cm^2$ can be raised to about 13% which is comparable to that of the GaAs materials without changing the properties of the silicon materials, the silicon materials will have the advantage over the GaAs materials in that the space-use silicon solar cells can have a radiation resistance equal to that of the GaAs solar cells while at the same time making the most of their benefits.

Approach for improving characteristics after exposure to radiation is generally divided into two directions. One is to improve initial characteristics before the exposure to radiation, and the other is to avoid effects of radiation. As to the former one, a lot of organizations have studied long since as one of the most important challenges in development of solar cells, and now it is becoming more difficult to find out a way to a great improvement of the present situation. As to the latter one, there lie a number of problems in applying theoretical means for improving characteristics to an actual production of solar cells and therefore it is not easy.

Generally, the thinner the substrate of a solar cell is, the less susceptible the solar cell is to the effect of radiation. For producing a thin solar cell, a thin substrate must be handled. However, in the case where a substrate of a crystalline semiconductor is used, as the substrate is thinner, the possibility that the substrate breaks during production of a solar cell becomes stronger and eventually the solar cell cannot be produced.

In conventional techniques, the possibly smallest thickness of the substrate is about 30 μm for a solar cell having a simple construction requiring only a little patterning of the substrate and about 50 μm for a high-efficiency solar cell whose substrate is subjected to a complicated patterning such as the reflection-reducing surface structure. As regards electrical output characteristics of these solar cells after exposure to radiation, the high-efficiency solar cell is more excellent even if its substrate has a thickness of 100 μm or more, because the characteristics of these solar cells before the exposure to radiation are quite different. For example, the high-efficiency solar cell of 100 μm thickness exhibits a conversion efficiency of about 12% to the AM0 light source after it is exposed to $1 \times 10^{15}/cm^2$ of electron beams having an acceleration energy of 1 MeV, while the solar cell of a simple construction of 50 μm thickness exhibits a conversion efficiency of about 11%.

With the trend to diversification and cost-reduction of satellites, there are demands for further improvement in performance. The conversion efficiency of the conventional high-efficiency solar cells is high for silicon solar cells, but it is demanded that the radiation resistance thereof be improved to a level equal to the GaAs-base solar cells and that the final output be enhanced. This has been considerably difficult.

SUMMARY OF THE INVENTION

Under these circumstances, the present invention provides a solar cell comprising a crystalline substrate having projections and depressions formed on either side or both sides of the substrate, wherein a projection-depression depth is 25 $\mu$m or more.

In another aspect the present invention provides a process for producing a solar cell comprising the step of etching a substrate using a mask comprising a frame having a width of 2 $\mu$m or more to 4 $\mu$m or less and quadrangular patterns formed at a pitch of 35 $\mu$m or more on the mask, thereby to form projections and depressions with a depth of 25 $\mu$m or more on either side or both sides of the substrate.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

First, the present inventors have found the following physical fact about the electrical output characteristic of silicon solar cells after exposure to radiation: When projections and depressions provided on the surface of solar cells for reducing reflection have a depth larger than a certain value, the radiation resistance characteristic of the solar cells is improved and also as easy a handling as conventional can be provided in manufacture of the solar cells.

More particularly, by increasing the projection-depression depth of the reflection-reducing structure of a silicon solar cell having the same substrate thickness as the conventional solar cell, it is possible to obtain the same effect on the radiation resistance as if the substrate had a reduced thickness, and it is also possible to obtain a productivity equal to the conventional one because the thickness of the substrate remains the same and thus the substrate does not break easily.

Here, the crystalline substrate is a substrate for composing a solar cell and a semiconductor substrate may usually be used as such. A variety of examples may be mentioned including semiconductors such as silicon and germanium and compound semiconductors such as silicon germanium, GaAs, InGaAs and InPGaAs, among which silicon may be preferred. The substrate may be of either monocrystalline or polycrystalline crystal, or may be of a monocrystalline or polycrystalline semiconductor obtained by crystallizing an amorphous semiconductor. The substrate may preferably be monocrystalline.

Figure 1:
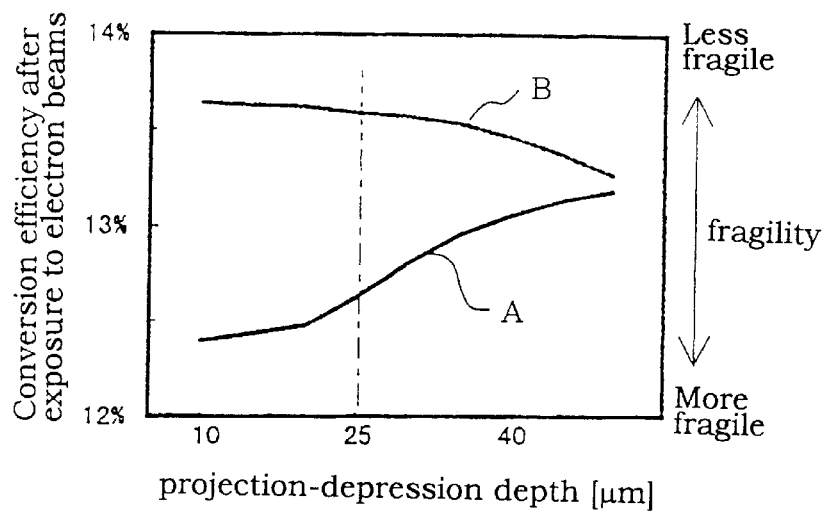
FIG. 1 is a graphical representation showing a relationship among a projection-depression depth, conversion efficiency after exposure to electron beams and fragility of a solar cell in accordance with the present invention.

For example, FIG. 1 shows a relationship of the radiation resistance (the conversion efficiency to the AM0 light source after exposure to 1 MeV electron beams at $1 \times 10^{15}/cm^2$) and the fragility of substrates during production with respect to the projection-depression depth of the texture structures, in the case where the substrates are 80 $\mu$m thick by forming, as reflection-reducing structures, texture structures on monocrystalline silicon substrates having a crystal orientation of the (100) face on their surface by an anisotropic etching to expose the (111) face selectively. Line A represents the conversion efficiency after the exposure of electron beams and line B represents the fragility of the substrates during production.

Figure 2:
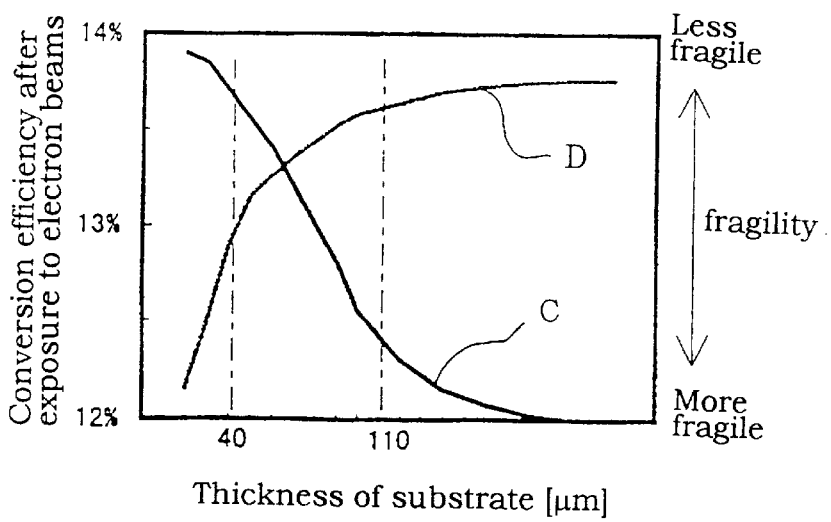
FIG. 2 is a graphical representation showing a relationship among the thickness of a substrate, conversion efficiency after exposure to electron beams and fragility of a solar cell in accordance with the present invention.
Figure 3A:
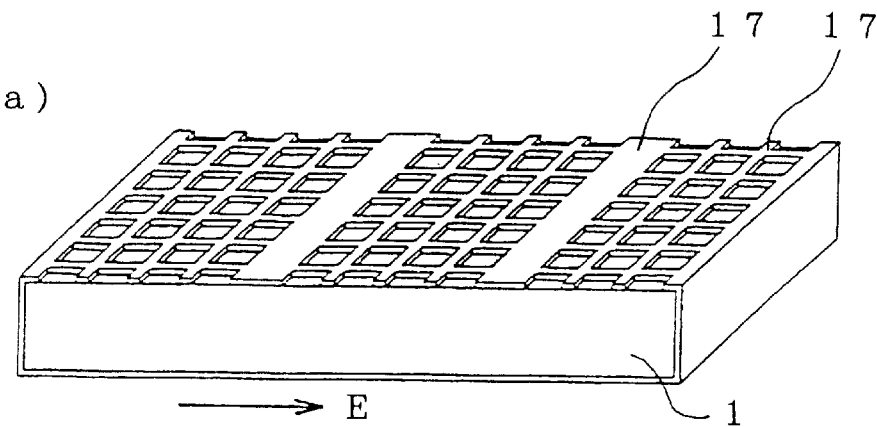
FIGS. 3(a) to 3(d) are schematic perspective views illustrating production steps for forming a texture structure of an inverted pyramid type in a solar cell in accordance with the present invention.
Figure 3B:
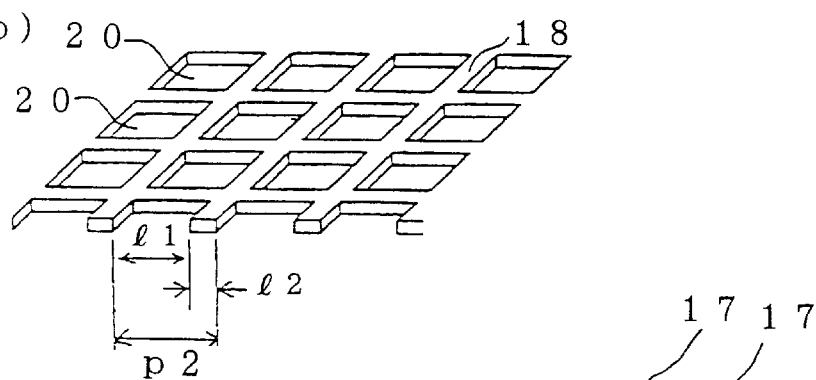
Figure 3C:
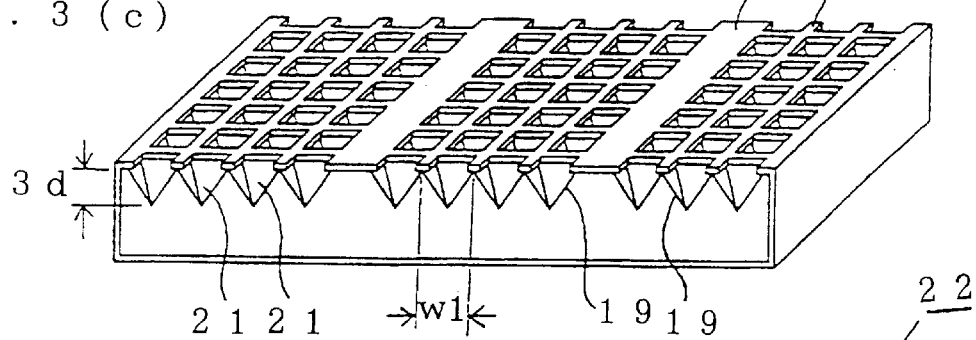
Figure 3D:
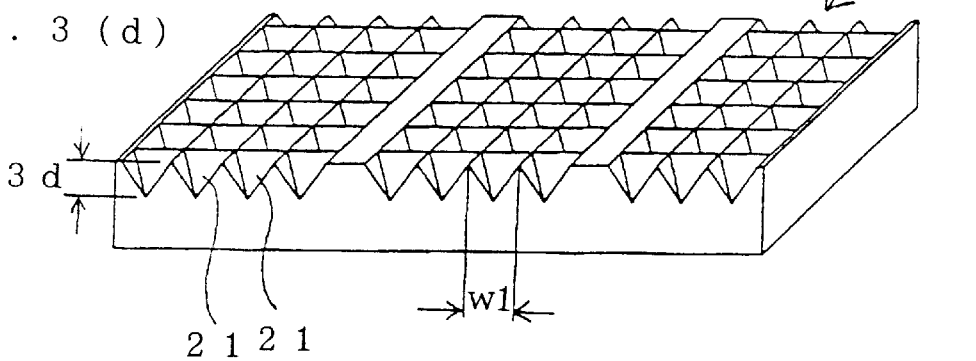

Further, FIG. 2 shows a relationship of the radiation resistance (the conversion efficiency to the AM0 light source after the exposure of the same conditions) and the fragility of substrates during production with respect to the thickness of substrates, in the case where the texture structures have a 30 $\mu$m depth by forming texture strictures. Line C represents the conversion efficiency after the exposure to electron beams and line D represents the fragility of the substrates during production.

FIG. 1 shows that the radiation resistance improves sharply in a region where the projection-depression depth increases exceeding 25 $\mu$m, while the fragility does not vary significantly.

FIG. 2 shows that, with regard to substrates having a projection-depression depth as large as 30 $\mu$m, the radiation resistance improves sharply in a region where the thickness of the substrates decreases below 110 $\mu$m, but that the substrate becomes more fragile steeply as its thickness decreases below 40 $\mu$m.

These relationships lead to a conclusion that a depth in the texture structure of 25 $\mu$m or more and a thickness of the substrate of 40 $\mu$m to 110 $\mu$m (with 40 $\mu$m and 110 $\mu$m included) provide a substrate fragility within such a range that brings little loss in production and a remarkable improvement in the radiation resistance. About these relationships, substantially the same results are obtained with respect to the depth of the reflection-reducing surface structure even if the type of the reflection-reducing surface structure varies, and the relationships may apply to the surface structures of the normal pyramid and inverted pyramid, and other reflection-reducing structures.

In the case of the above-described solar cell which has, as the reflection-reducing projection-depression surface structure, the texture structure exposing the (111) faces formed on the (100) face which is the surface of the monocrystalline silicon, the projection-depression depth can be set to 25 μm or more by designing squares of the texture pattern (as seen from the direction perpendicular to the surface) to have a side-length, i.e., a width of a groove, of 35 μm or more, because the angle defined by the (100) face and the (111) face is constant.

Within the aforesaid ranges for the projection-depression depth and the substrate thickness obtained from FIGS. 1 and 2, the radiation resistance improves considerably and only a few substrates break.

Furthermore, combining these ranges has the most outstanding effect in providing a photoelectric conversion efficiency of 12.8% to 12.9% after the exposure to 1 MeV electron beams at $1 \times 10^{15}/cm^2$ and also in producing solar cells which are more functional and requires more complicated production steps than the conventional solar cells, in a good yield with fewer breaks of substrates. The above-mentioned photoelectric conversion efficiency is equal to that of solar cells of GaAs materials which occupy a central position in materials excellent in the radiation resistance.

A solar cell which includes a monocrystalline silicon substrate having a thickness of 50 μm to 80 μm (with 50 μm and 80 μm included) and having the (100) face on its surface and which has on the substrate a texture structure provided with inverted pyramids arranged at a pitch of 35 μm to 70 μm (with 35 μm and 70 μm included) and having the same width as the pitch and a projection-depression depth of 25 μm to 50 μm (with 25 μm and 50 μm included) is the most excellent in productivity and exhibits good characteristics.

In order to produce such a solar cell, a mask layer is first formed on the entire surface of a silicon substrate having been processed to have a thickness of 40 μm to 110 μm, preferably 50 μm to 80 μm. This mask layer serves as a mask for a later anisotropic etching for forming a texture structure, and may be formed of silicon oxide or silicon nitride, for example, but is not limited thereto. Material for the mask layer may be selected depending on the kind of a solution and/or a gas used for the etching.

Explanation is now given to an exemplary process for forming a texture structure with reference to FIGS. 3(*a*) to 3(*d*), where the reflection-reducing structure to be formed is of the inverted pyramid type.

FIG. 3(*a*) shows a state in which a mask layer 17 is formed on a substrate 1 and arrow E represents the direction of the <110> crystal axis. FIG. 3(*b*) is an enlarged view illustrating the mask layer 17. As shown in FIGS. 3(*a*) and 3(*b*), the mask layer 17 is patterned into a pattern which includes square windows 20 having side in a direction parallel with or perpendicular to the <110> crystal axis direction E and being arranged at a pitch p2 of 35 μm or more together with frames 18 of the mask material surrounding the squares and having a width l2 of 2 μm to 4 μm (with 2 μm and 4 μm included). The pattern is formed continuously on the substrate so that the surface of the substrate may be made into the reflection-reducing structure almost entirely.

The shape of the windows, however, maybe selected from other quadrangles such as rectangle and rhombus depending on the kind of the substrate and the type of the texture structure to be formed thereon. The mask layer 17 may be easily patterned by means of the conventional technique such as a photolithography and etching technique. The side-length l1 of the square window 20, and the width l2 of the frames and the pitch p2 may be selected in consideration of the projection-depression depth of the texture structure to be formed by the later etching for forming the texture structure since they define the projection-depression depth.

FIG. 3(*c*) shows the state of the surface after the anisotropic etching is conducted. Depressions 21 in the shape of inverted pyramids are formed, the width w1 of the depressions is 35 μm or more, and the depth d3 of the depressions is 25 μm or more. As shown in FIG. 3(*d*), the mask layer 17 is removed by an acid treatment or the like after the etching for texture structure formation is finished. Thus obtained is a reflection-reducing surface structure 22 in the inverted pyramid type.

As described above, in the present invention, the projections and depressions of the texture structure can be formed to have a depth d3 of 25 μm or more by setting the pitch p2 to 35 μm or more, and the width l2 of the frames to 2 μm or more to 4 μm or less.

Here, the width l2 of the frames 18 made of the mask layer is about 1 μm in the conventional technique, but in the present invention it is suitably wider than conventional, i.e., 2 μm to 4 μm (with 2 μm and 4 μm included), preferably about 3 μm.

Conventionally, this width must be narrow, about 1 μm, because, at the anisotropic etching for forming the texture structure, the etch rate is slower at portions of the substrate covered with the mask layer and these portions remain almost flat after the etching, so that the reflection-reducing surface structure is not obtained in the portions. However, according to the present invention, the substrate must be immersed in an etching solution for a long time for the purpose of obtaining a deep texture structure featuring the present invention. This long-time etching allows the substrate under the mask layer to be etched in a direction parallel to the surface of the substrate, and the amount of this parallel etching is not negligible any more.

This gives rise to a need to set a suitable width. In the present invention, the width of the frames is set to 2 μm to 4 μm (with 2 μm and 4 μm included), preferably 3 μm, in order that the substrate should be etched to form projections and depressions of a depth of 25 μm or more and the area of portions beneath the mask layer which remain unetched and flat should be negligible. This setting allows the formation of a good texture structure of the inverted pyramid type which has a projection-depression depth d3 of 25 μm or more.

Figure 4:
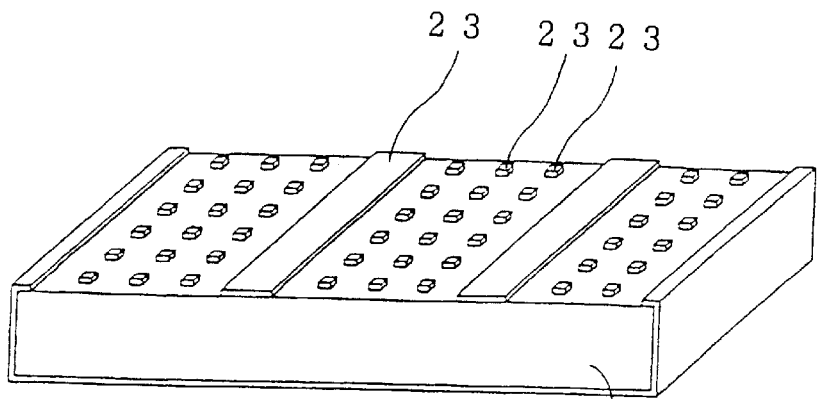
FIGS. 4(a) to 4(d) are schematic perspective views illustrating production steps for forming a texture structure of a normal pyramid type in a solar cell in accordance with the present invention.
Figure 4:
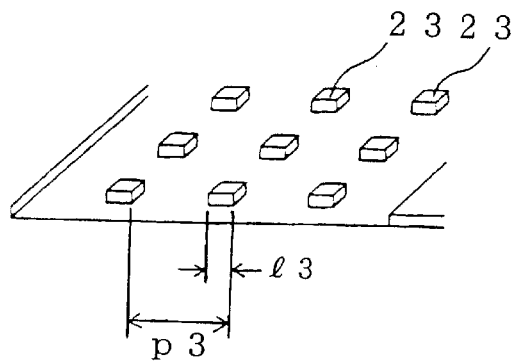
Figure 4:
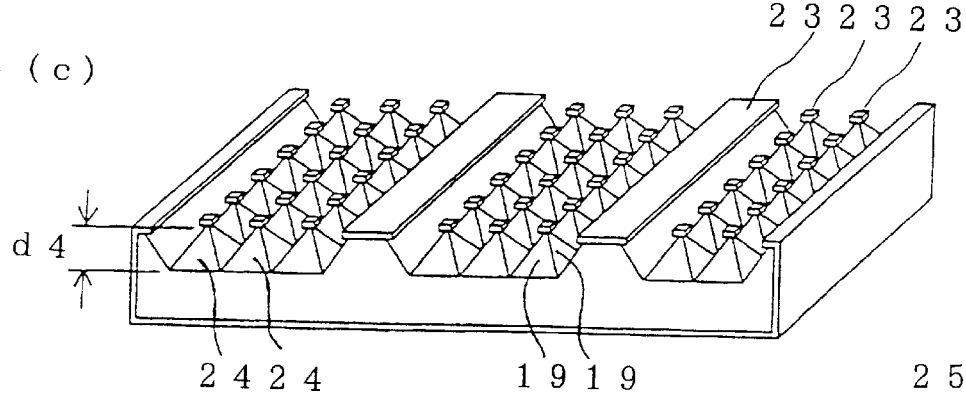
Figure 4:
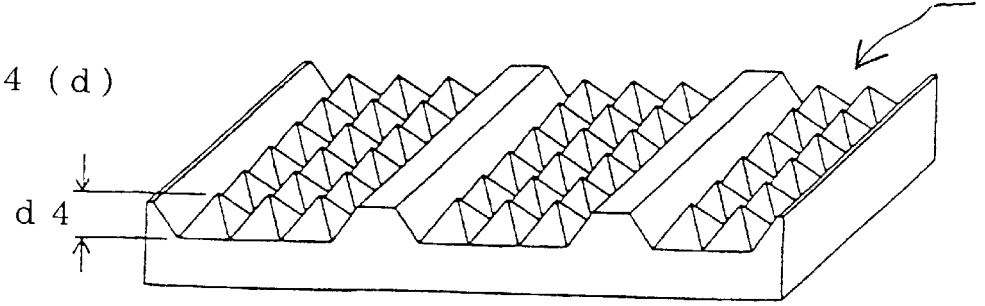

Explanation is further given to a process for forming a texture structure with reference to FIGS. 4(*a*) to 4(*d*), where the reflection-reducing structure to be formed is of the normal pyramid type.

FIG. 4(*a*) shows the state in which a mask layer 23 is formed on a substrate 1 and FIG. 4(*b*) is an enlarged view illustrating the mask layer 23. As shown in FIGS. 4(*a*) and 4(*b*), the mask layer 23 patterned in squares or the like is placed at positions which are to be vertices of pyramids after etching. Thereafter, the anisotropic etching for forming the texture structure is carried out.

For the same reasons as in the case of the inverted pyramid type, the projection-depression depth d4 becomes 25 μm or more by setting the distance between the vertices of pyramids, i.e., a pitch p3, to 35 μm or more. As regards patterns of the mask layer placed on the positions to be the vertices of the pyramids, if the mask layer is in squares, the size of the squares may desirably be such that the side length l3 is 2 μm to 4 μm, preferably about 3 μm and the squares are arranged at a pitch p3 of 35 μm or more. The shape of the mask layer may be selected from other quadrangles such as rectangle and rhombus depending on the kind of the substrate and the type of the texture structure to be formed thereon.

Similarly to the case of the inverted pyramid type, FIG. 4(c) shows the state of the surface after the anisotropic etching is conducted. Projections 24 are formed, and the projection-depression depth d4 is 25 μm or more. As shown in FIG. 4(d), the mask layer 23 is removed by an acid treatment or the like after the etching for texture structure formation is finished. Thus a reflection-reducing surface structure 25 in the normal pyramid type is obtained.

The reflection-reducing structure may also be formed in V-shaped grooves using striped mask layers, though not shown.

After the texture structure is thus formed and the mask layer is removed, a first diffusion layer(p$^+$) is formed on a rear side of the substrate opposite to the light-receptive side, and a second diffusion layer (n$^+$) of a conductivity type opposite to that of the first diffusion layer is formed on the light-receptive side on which the reflection-reducing structure has been formed. Thereafter, similarly to the conventional process, electrodes are formed on both the light-receptive side and the rear side and an anti-reflection film is formed on the light-receptive side. Thus the space-use solar cell of the present invention is produced.

An exemplary process for producing the solar cell of the present invention is now described with reference to figures.

FIGS. 5(a) to 5(g) are schematic sectional views illustrating a production process for a solar cell in accordance with the present invention. FIGS. 6(a) to 6(d) are schematic views corresponding to FIGS. 5(c), 5(d), 5(e) and 5(g), respectively.

Figure 5:
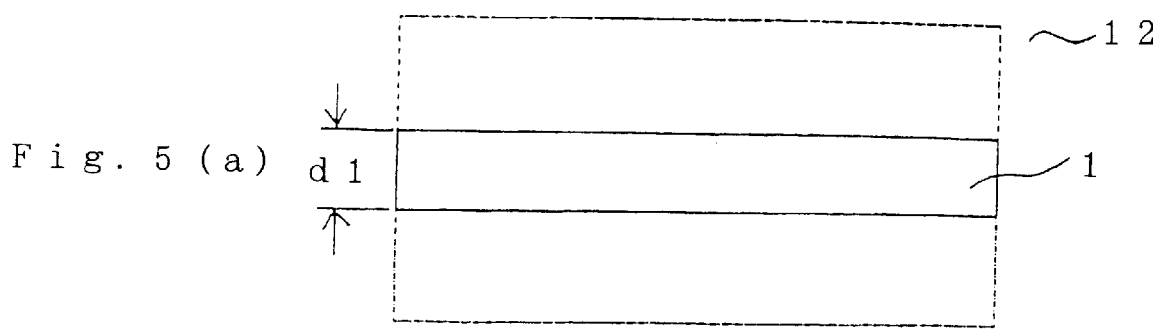
FIGS. 5(a) to 5(g) are schematic sectional views illustrating a production process flow for a space-use solar cell in accordance with the present invention.
Figure 5:
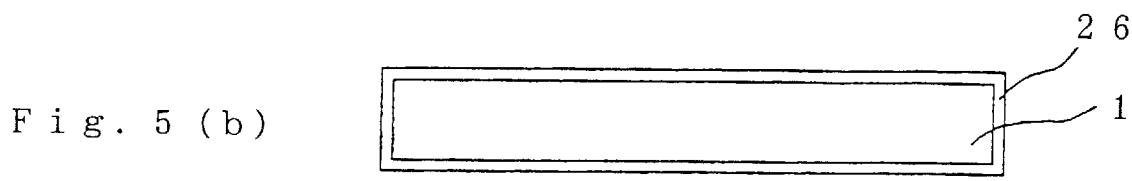
Figure 5:
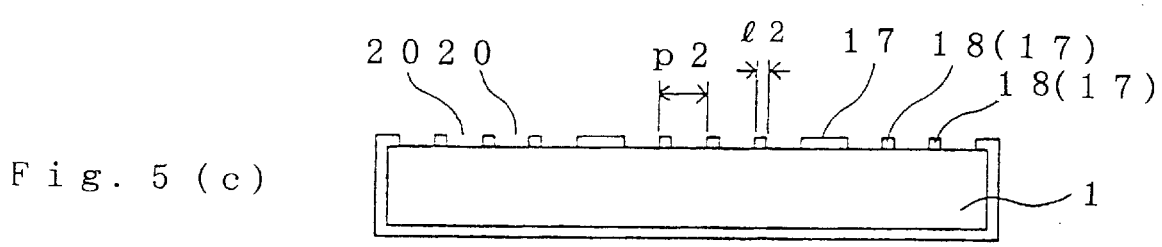
Figure 5:
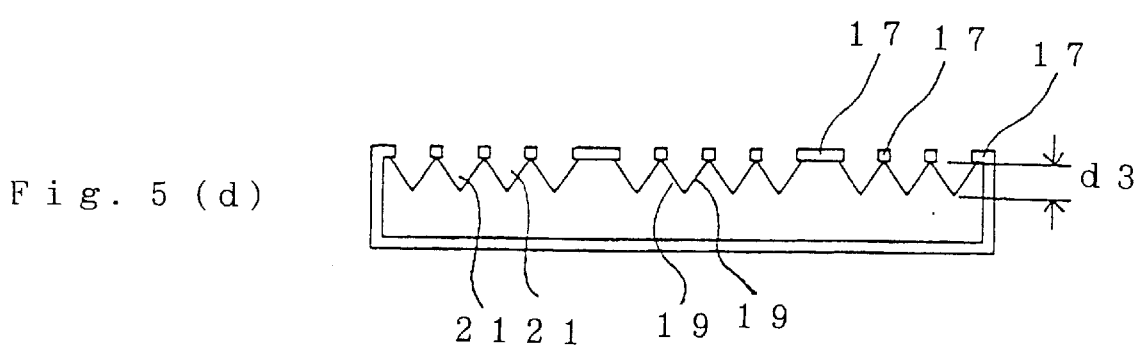
Figure 5:
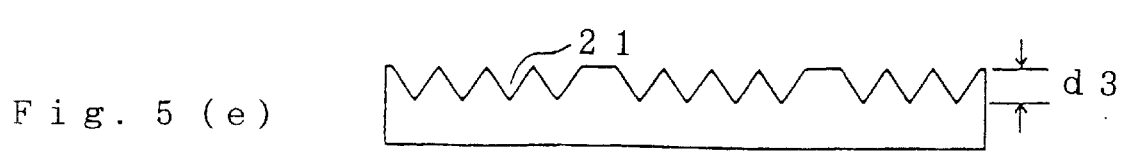
Figure 5:
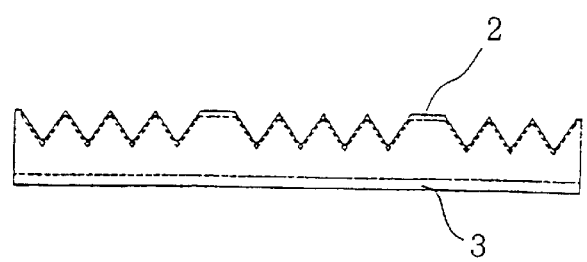
Figure 5:
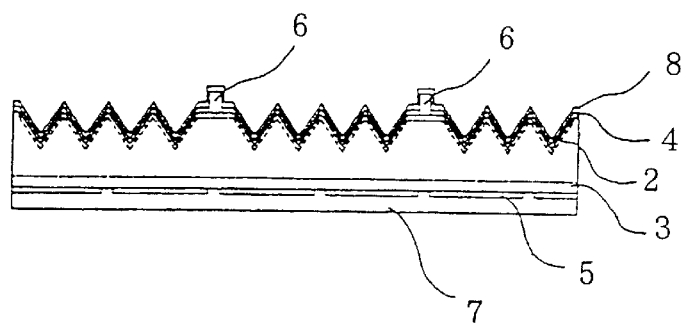

First, a monocrystalline silicon substrate 12 cut from an ingot in the form of a wafer which substrate has the (100) face on its surface is etched to have a thickness d1 of 70 μm with an aqueous solution of sodium hydroxide, thereby to obtain a substrate 1 (see FIG. 5(a)).

After a cleaning step, a thermally oxidized film 26 is formed as a mask material on the entire surface of the silicon substrate 1 (see FIG. 5(b)).

The thermally oxidized film 26 on a light-receptive side is patterned by a photolithography and etching technique.

For this etching, a pattern including square windows 20 arranged at a pitch p2 of 40 μm and frames 18 of the mask layer having a width l2 of 3 μm and surrounding the square windows is transferred to the mask material 26. The square windows 20 have sides in a direction parallel with or perpendicular to the <110> crystal axis. By patterning, the mask material 26 is formed into a mask layer 17 having a structure in which the 3 μm wide frames 18 surround the square windows 20 with a side length of 37 μm which are arranged at the pitch p2 of 40 μm (see FIGS. 5(c) and 6(a)).

The pitch p2 and the width l2 of the frames are determined in consideration of the projection-depression depth d3 of the texture structure. If the pattern of squares is such that the pitch p2 and the width l2 of the frames are set to 40 μm and 3 μm, respectively, the projections and depressions will have a depth d3 of about 30 μm by the later etching for texture structure formation.

The substrate whose oxide film on the light-receptive side has been thus patterned is immersed in an 8% aqueous solution of KOH heated to 80° C. for 60 minutes for etching. Thereby, the etching proceeds from the square windows 20 with a side length of 37 μm which are not masked with the oxide film, so that a texture structure 21 of the inverted pyramid type having a depth of about 30 μm is obtained (see FIGS. 5(d) and 6(b)). At the same time, the etching proceeds also in the direction parallel to the surface of the substrate beneath the mask layer and the width w1 of the depressions at the surface becomes 40 μm.

Figure 6A:
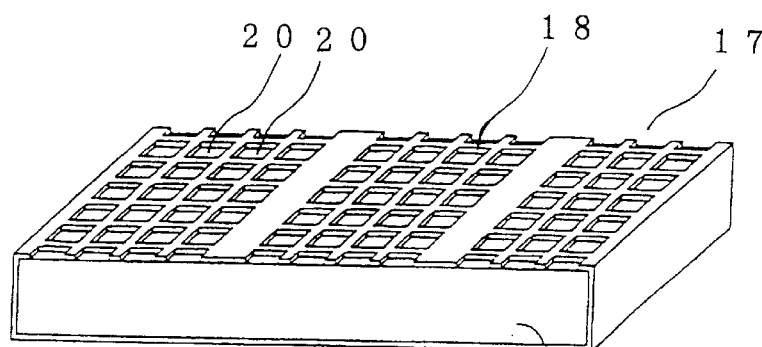
FIGS. 6(a) to 6(d) are schematic views corresponding to views illustrating the production process flow shown in FIGS. 5(a) to 5(g)
Figure 6B:
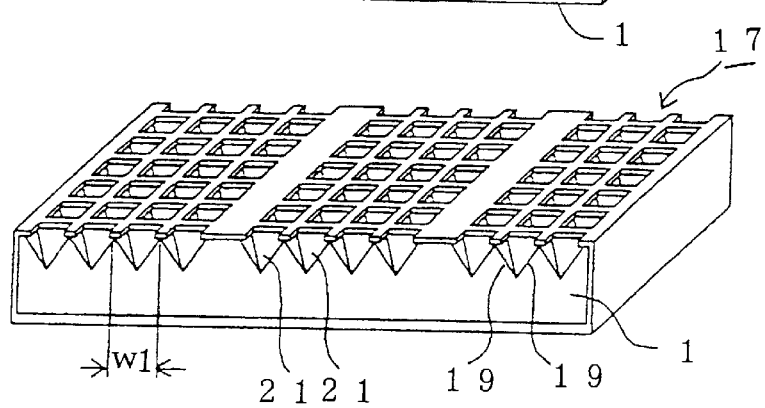
Figure 6C:
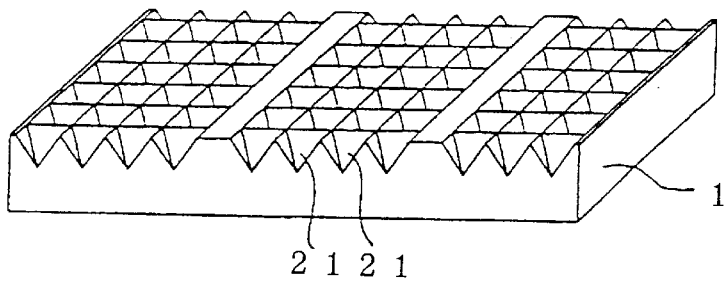
Figure 6D:
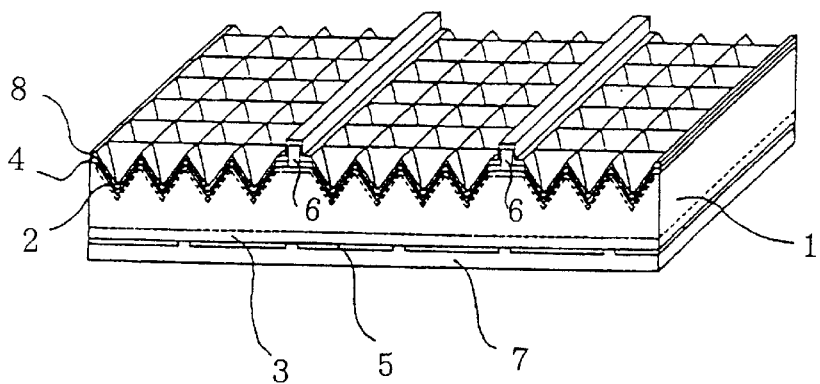
Figure 7:
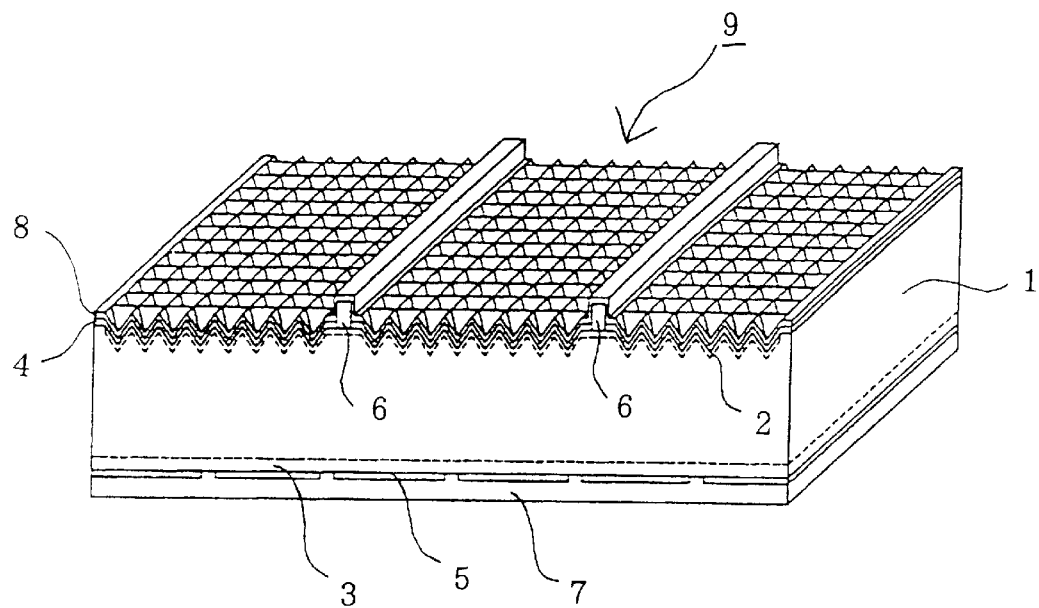
FIG. 7 is a schematic view illustrating a conventional high-efficiency solar cell.
Figure 8:
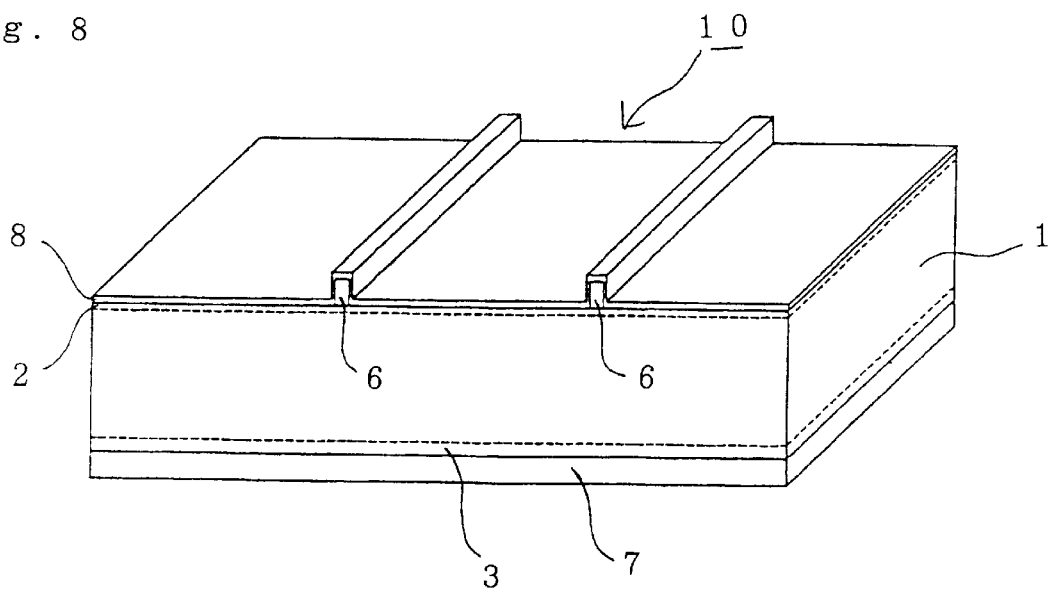
FIG. 8 is a schematic sectional view illustrating a solar cell produced by a relatively simple conventional process.
Figure 9:
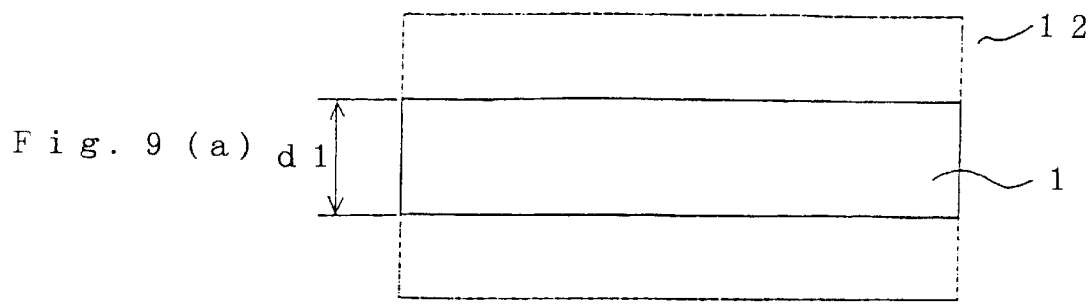
FIGS. 9(a) to 9(g) are schematic sectional views illustrating a production process flow for a conventional space-use solar cell.
Figure 9:
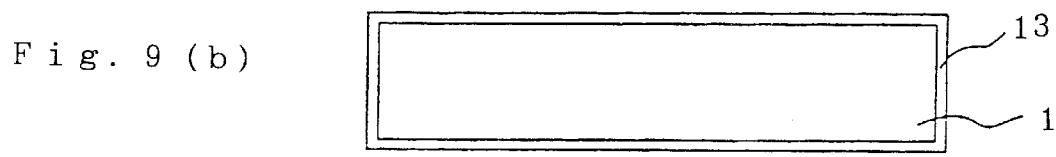
Figure 9:
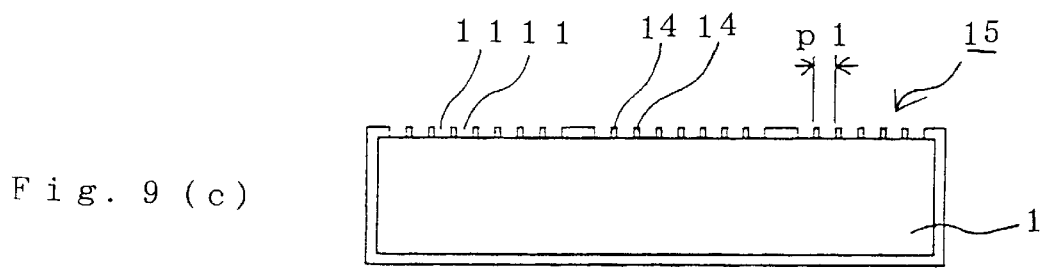
Figure 9:
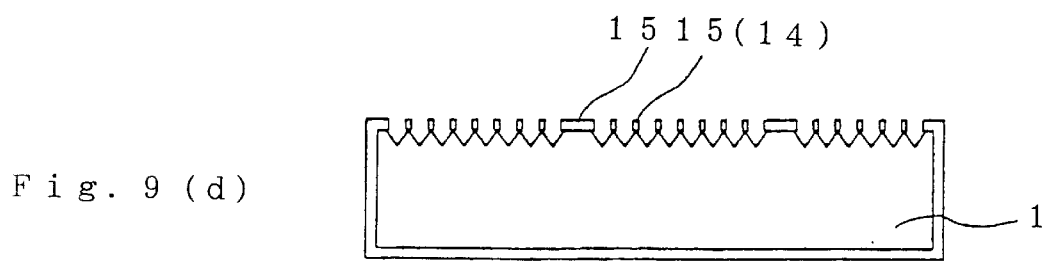
Figure 9:
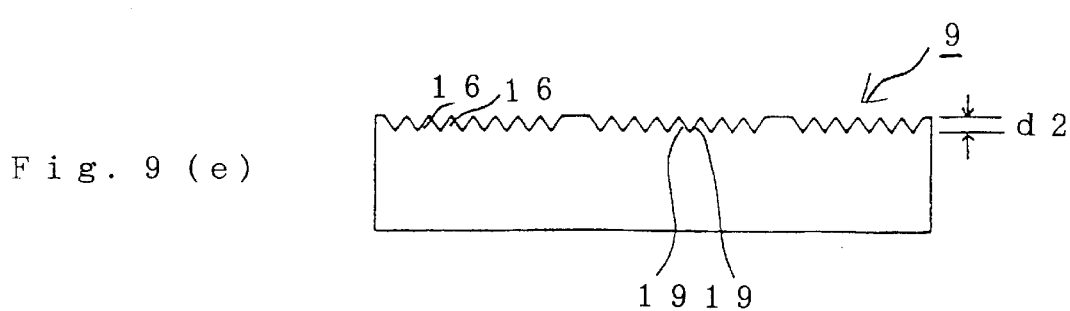
Figure 9:
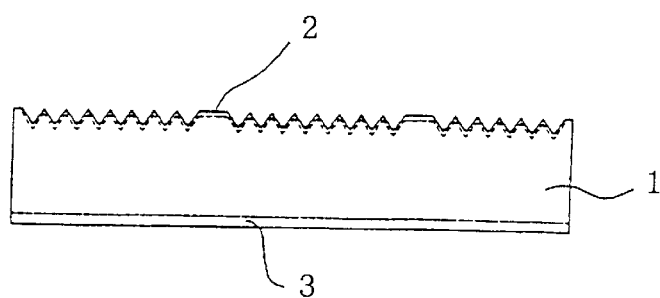
Figure 9:
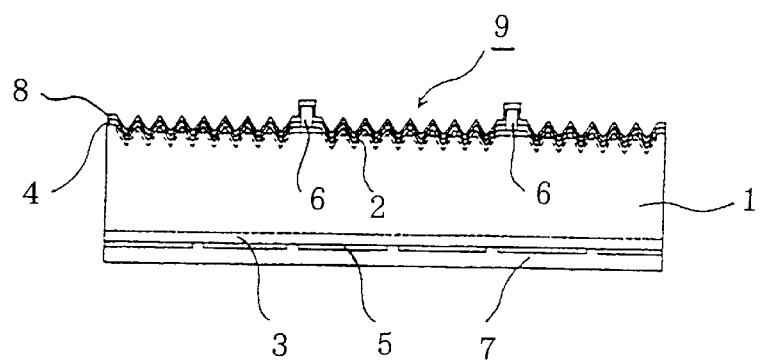

After removing the mask layer 17 from the entire surface of the substrate (see FIGS. 5(e) and 6(c)), a P$^+$-type region 3 is formed on the entire surface on a side opposite to the light-receptive face and also a high-concentration N-type region 2 is formed on the light-receptive side (see FIG. 5(f)). Insulating films 4 and 5 are formed, respectively. Thereafter, electrodes 6 and 7 are formed on the light-receptive face and the opposite face, respectively, and an anti-reflection film 8 is formed on the entire light-receptive face (see FIG. 5(g)). Thus a high-efficiency monocrystalline silicon solar cell having an excellent radiation resistance is obtained (see FIG. 6(d)).

With the above-described constitution, the present invention provides a solar cell exhibiting an improved radiation resistance and allowing as easy handling in production as the conventional solar cell, by setting 25 μm or more for the depth of projections and depressions provided on the surface of the substrate of the solar cell for reducing reflection. In other words, by increasing the projection-depression depth of the reflection-reducing surface structure of the silicon solar cell which substrate is as thick as the conventional one, it is possible to obtain as good a radiation resistance as would be obtained if the thickness of substrate were reduced. Also it is possible to realize as good a productivity as the conventional solar cell because the thickness of the substrate is the same as the conventional one and therefore the substrate is not broken easily.

Further, by forming the projections and depressions in the form of normal pyramids, inverted pyramids, V-shaped grooves or the like, the reflection of incident light can be effectively reduced.

Further, by using a crystalline silicon substrate, a silicon solar cell suitable for space use can be produced.

Still further, by forming, as the reflection-reducing structure, the texture structure by means of an anisotropic etching into such that the (111) faces are selectively exposed on the monocrystalline substrate having the (100) face of crystal orientation on its surface, it is possible to realize a fragility for the substrate which is too small to impair the productivity, and also it is possible to produce a solar cell excellent in radiation resistance.

Furthermore, in the case where the solar cell has a texture structure including (111) faces exposed on the (100) face which is the surface of the monocrystalline silicon, the depth of the texture structure can be made 25 μm or more by setting the width of depressions of the texture pattern to 35 μm or more, because the angle defined by the (100) face and the (111) face is constant.

Furthermore, by setting the thickness of the substrate to 40 μm to 110 μm (with 40 μm and 110 μm included), it is possible to obtain a substrate fragility within such a range that does not cause trouble in production, and also it is possible to produce a solar cell excellent in the radiation resistance.

Further, by using a silicon substrate having a thickness of 50 μm to 110 μm (with 50 μm and 110 μm included) and the (100) face on its surface and by forming a texture structure of inverted pyramids having a width of 35 μm to 70 μm (with 35 μm and 70 μm included) and a depth of 25 μm to 50 μm (with 25 μm and 50 μm included) continuously on the surface of the substrate, it is possible to produce a solar cell which is most excellent in productivity and exhibits good characteristics.

Further, etching the substrate using a mask having a pattern of squares, rectangles or rhombi arranged at a pitch of 35 µm or more and surrounded by frames of 2 µm to 4 µm (with 2 µm and 4 µm included) width allows the area of a portion of the substrate beneath the mask which remains unetched and flat to be reduced to such a degree that can be neglected, and therefore a desirable projection-depression structure having a depth of 25 µm or more can be produced stably in a good yield.

What is claimed is:

1. A solar cell comprising:

a crystalline substrate having a thickness of 40 µm or more to 110 µm;

the substrate having projections and depressions formed on either side or both sides of the substrate, wherein a projection-depression depth is 25 µm less than 50 µm, and the projections surround all sides of the depressions or the depressions surround all sides of the projections.

2. A solar cell according to claim 1, wherein the projections and depressions are in the form of pyramids or inverted pyramids.

3. A solar cell according to claim 1, wherein the crystalline substrate is made of silicon.

4. A solar cell according to claim 3, wherein the crystalline substrate is a silicon wafer having a (100) crystal face, and a (111) crystal face is exposed on a surface of the projections and depressions.

5. A solar cell according to claim 1, wherein the projections have bottoms in the shape of quadrangles whose side length is at least 35 µm, or the depressions have a width of at least 35 µm on the surface of the substrate.

6. A solar cell according to claim 5, wherein the quadrangles are squares, rectangles or rhombi.

7. A solar cell according to claim 1, wherein the substrate is a monocrystalline silicon substrate having a thickness of 50 µm to 80 µm, the projections and depressions forms a texture structure of an inverted pyramid type formed by exposing a (111) face of silicon on a light-receptive side of the substrate, the texture structure of the inverted-pyramid type has a depth of 25 µm or more to 50 µm, and inverted pyramids of the texture structure is arranged at a pitch of 35 µm to 70 µm.

8. A process for producing a solar cell comprising the step of etching a substrate using a mask comprising a frame having a width of 2 µm to 4 µm and quadrangular patterns formed at a pitch of 35 µm or more on the mask, thereby to form projections and depressions with a depth of 25 µm or more on either side or both sides of the substrate.

* * * * *